(12) United States Patent
Lee et al.

(10) Patent No.: US 10,522,360 B2
(45) Date of Patent: Dec. 31, 2019

(54) METHOD FOR FORMING SEMICONDUCTOR DEVICE STRUCTURE WITH ETCH STOP LAYER

(71) Applicant: Taiwan Semiconductor Manufacturing Co., Ltd., Hsinchu (TW)

(72) Inventors: Ya-Ling Lee, Hsinchu (TW); Shing-Chyang Pan, Jhudong Township, Hsinchu County (TW); Keng-Chu Lin, Chaozhou Township, Pintung County (TW); Wen-Cheng Yang, Hsinchu (TW); Chih-Tsung Lee, Hsinchu (TW); Victor Y. Lu, Foster City, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/730,934

(22) Filed: Oct. 12, 2017

(65) Prior Publication Data

US 2018/0166285 A1    Jun. 14, 2018

Related U.S. Application Data

(60) Provisional application No. 62/434,138, filed on Dec. 14, 2016.

(51) Int. Cl.
*H01L 21/285*    (2006.01)
*H01L 21/8234*   (2006.01)
*H01L 21/3065*   (2006.01)
*H01L 21/02*     (2006.01)
*H01L 21/768*    (2006.01)

(52) U.S. Cl.
CPC .... *H01L 21/2855* (2013.01); *H01L 21/02178* (2013.01); *H01L 21/02266* (2013.01); *H01L 21/3065* (2013.01); *H01L 21/76802* (2013.01); *H01L 21/76834* (2013.01); *H01L 21/823437* (2013.01)

(58) Field of Classification Search
CPC combination set(s) only.
See application file for complete search history.

(56) References Cited

U.S. PATENT DOCUMENTS

2007/0209925 A1* 9/2007 Tang ............... C23C 14/165
                                                204/192.1
2015/0114823 A1* 4/2015 Lee ............... C23C 14/3471
                                                204/192.12

(Continued)

*Primary Examiner* — Ratisha Mehta
(74) *Attorney, Agent, or Firm* — Birch, Stewart, Kolasch & Birch, LLP

(57) ABSTRACT

A method for forming a semiconductor device structure is provided. The method includes disposing a semiconductor substrate in a physical vapor deposition (PVD) chamber. The method also includes introducing a plasma-forming gas into the PVD chamber, and the plasma-forming gas contains an oxygen-containing gas. The method further includes applying a radio frequency (RF) power to a metal target in the PVD chamber to excite the plasma-forming gas to generate plasma. In addition, the method includes directing the plasma towards the metal target positioned in the PVD chamber such that an etch stop layer is formed over the semiconductor substrate.

20 Claims, 7 Drawing Sheets

(56) References Cited

U.S. PATENT DOCUMENTS

| | | | | |
|---|---|---|---|---|
| 2015/0140833 A1* | 5/2015 | Thadani | ............ | H01L 21/02219 |
| | | | | 438/762 |
| 2015/0311151 A1* | 10/2015 | Chi | ................ | H01L 23/528 |
| | | | | 257/773 |
| 2015/0325522 A1* | 11/2015 | Yeh | .................. | H01L 21/2855 |
| | | | | 257/741 |
| 2016/0240483 A1* | 8/2016 | Cheng | ............... | H01L 23/53223 |

* cited by examiner

METHOD FOR FORMING SEMICONDUCTOR DEVICE STRUCTURE WITH ETCH STOP LAYER

PRIORITY CLAIM AND CROSS-REFERENCE

This Application claims the benefit of U.S. Provisional Application No. 62/434,138, filed on Dec. 14, 2016, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
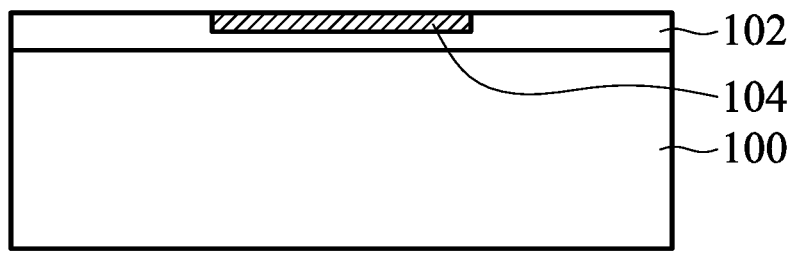
FIGS. 1A-1G are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1G are cross-sectional views of various stages of a process for forming a semiconductor device structure, in accordance with some embodiments. As shown in FIG. 1A, a semiconductor substrate 100 is provided. In some embodiments, the semiconductor substrate 100 includes a semiconductor wafer, a portion of a semiconductor wafer, or a semiconductor die. In some embodiments, the semiconductor substrate 100 includes silicon or other elementary semiconductor materials such as germanium.

In some other embodiments, the semiconductor substrate 100 includes a compound semiconductor. The compound semiconductor may include silicon carbide, gallium arsenide, indium arsenide, indium phosphide, one or more other suitable compound semiconductor materials, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, one or more other applicable methods, or a combination thereof.

In some embodiments, various device elements are formed in and/or on the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes.

In some embodiments, an interconnection structure is formed on the semiconductor substrate 100. The interconnection structure includes an interlayer dielectric layer 102 and one or multiple conductive features 104. The conductive feature 104 may include conductive lines, conductive vias, and/or conductive contacts. In some embodiments, the interlayer dielectric layer 102 includes multiple dielectric sublayers. Multiple conductive features such as conductive contacts, conductive vias, and conductive lines are formed in the interlayer dielectric layer 102.

The device elements in and/or on the semiconductor substrate 100 are interconnected through the interconnection structure over the semiconductor substrate 100. As a result, integrated circuit devices are formed. For example, the conductive feature 104 may be electrically connected to a doped region formed in the semiconductor substrate 100 through some of the conductive vias, some of the conductive lines, and/or some of the conductive contacts formed in the interlayer dielectric layer 102. The integrated circuit devices may include logic devices, memory devices (e.g., static random access memories, SRAMs), radio frequency (RF) devices, input/output (I/O) devices, system-on-chip (SoC) devices, image sensor devices, other applicable types of devices, or a combination thereof.

Figure 1B:
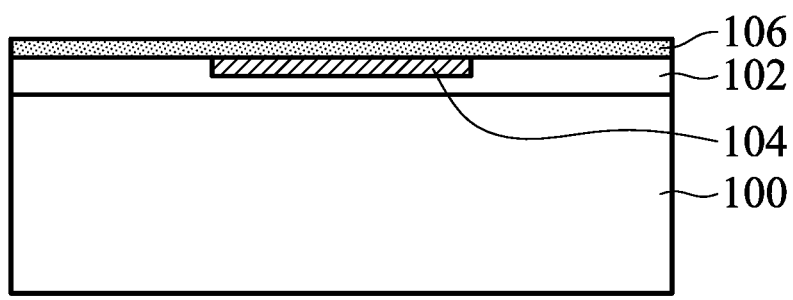

As shown in FIG. 1B, an etch stop layer 106 is deposited over the interlayer dielectric layer 102 and the conductive feature 104, in accordance with some embodiments. The etch stop layer 106 may be used to assist in the formation of recesses that will be formed in a dielectric layer that will be subsequently formed. In some embodiments, the etch stop layer 106 has a smaller dielectric constant than that of silicon nitride. In some embodiments, the etch stop layer 106 is an insulating layer that is used to electrically isolate conductive features.

In some embodiments, the etch stop layer 106 is made of or includes a metal oxide material. In some embodiments, the etch stop layer 106 is made of or includes aluminum oxide. In some embodiments, the etch stop layer 106 is deposited using a physical vapor deposition (PVD) process, a chemical vapor deposition (CVD) process, an atomic layer deposition (ALD) process, a spin-on process, one or more other applicable processes, or a combination thereof. In some embodiments, the etch stop layer 106 is deposited using a PVD process that involves the application of radio frequency (RF) power. The formation of the etch stop layer 106 will be illustrated in more detail later.

Figure 1C:
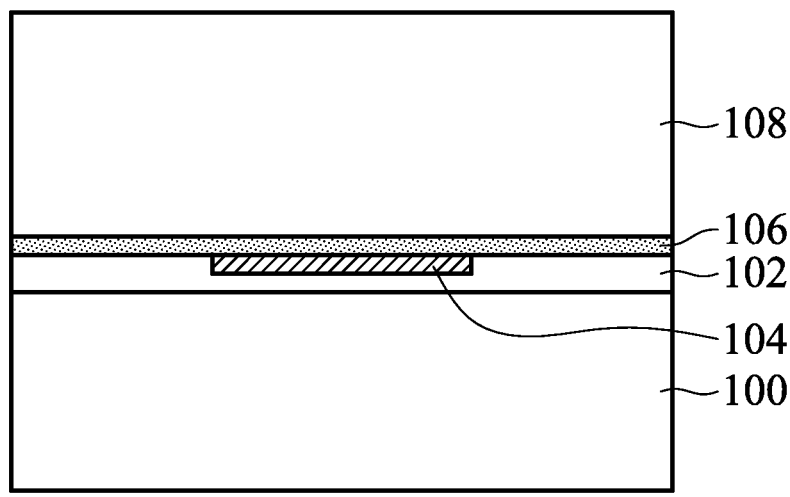

As shown in FIG. 1C, a material layer such as a dielectric layer 108 is deposited over the etch stop layer 106, in accordance with some embodiments. In some embodiments, the dielectric layer 108 is made of or includes a low dielectric constant (low-k) material, silicon oxide, silicon oxynitride, borosilicate glass (BSG), phosphoric silicate glass (PSG), borophosphosilicate glass (BPSG), fluorinated silicate glass (FSG), one or more other suitable materials, or a combination thereof. In some embodiments, the dielectric layer 108 is deposited using a CVD process, an ALD process, a spin-on process, one or more other applicable processes, or a combination thereof.

The low-k material may have a smaller dielectric constant than that of silicon dioxide. For example, the low-k material has a dielectric constant in a range from about 1.5 to about 3.5. As the density of semiconductor devices increases and the size of circuit elements becomes smaller, the resistance capacitance (RC) delay time increasingly dominates circuit performance. Therefore, using a low-k dielectric material as the dielectric layer 108 is helpful for reducing the RC delay.

In some embodiments, the etch stop layer 106 is made of or includes aluminum oxide that has a smaller dielectric constant than other etch stop material such as silicon nitride. Therefore, the RC delay may be reduced further.

A wide variety of low-k material may be used for forming the dielectric layer 108. In some embodiments, the dielectric layer 108 includes a porous dielectric material, an organic polymer, an organic silica glass, SiOF series material, a hydrogen silsesquioxane (HSQ) series material, a methyl silsesquioxane (MSQ) series material, a porous organic series material, a spin-on inorganic dielectric, a spin-on organic dielectric, one or more other suitable materials, or a combination thereof.

Figure 1D:
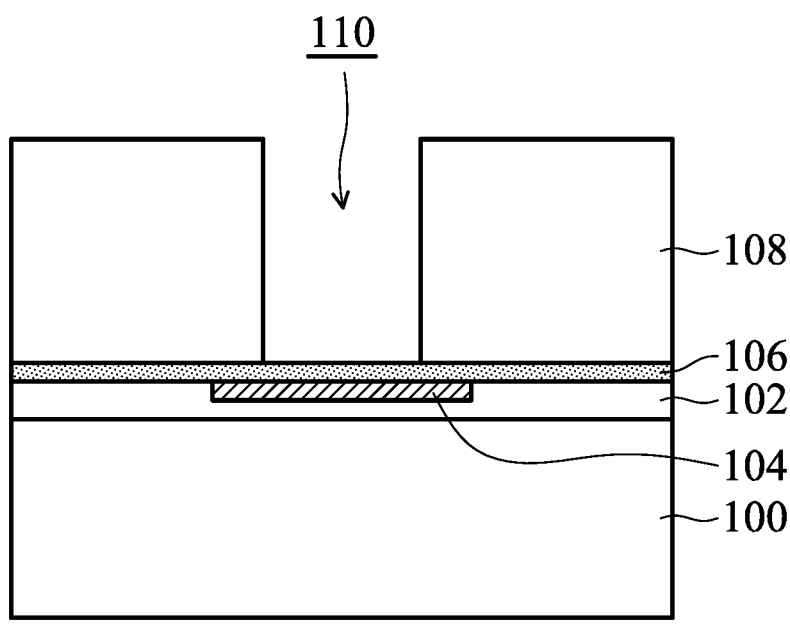

As shown in FIG. 1D, a recess 110 is formed in the dielectric layer 108, in accordance with some embodiments. In some embodiments, the recess 110 is a via hole that is used to contain a conductive via. In some other embodiments, the recess 110 is a trench that is used to contain a conductive line. In some other embodiments, the recess 110 is a combination of a trench and a via hole. In some embodiments, the recess 110 exposes the etch stop layer 106.

In some embodiments, the recess 110 is formed using a photolithography process and an etching process. In some embodiments, a patterned hard mask layer is used to assist in the formation of the recess 110. The etch process may include a dry etching process. During the etching process, the etch rate of the dielectric layer 108 is much higher than that of the etch stop layer 106. Therefore, the etch stop layer 106 prevents the conductive feature 104 thereunder from being etched or damaged during the etching process for forming the recess 110.

Figure 1E:
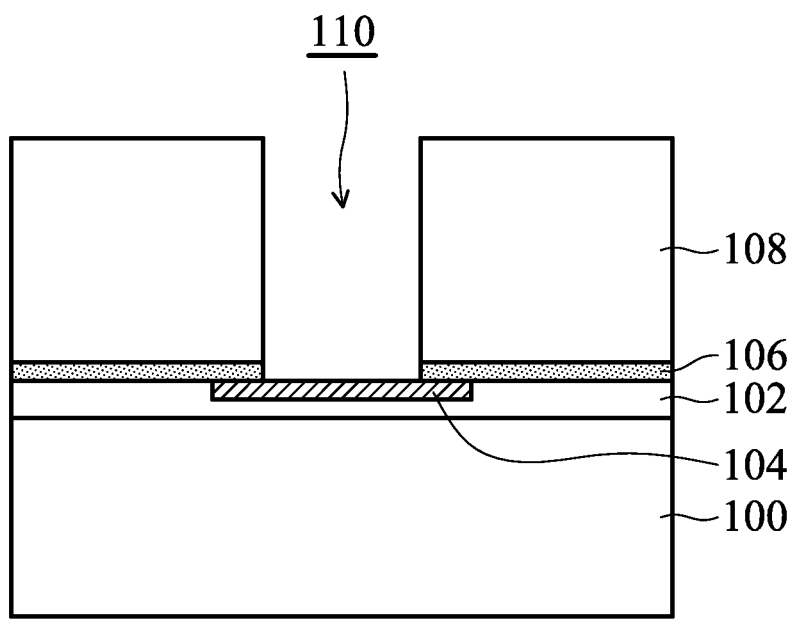

As shown in FIG. 1E, the etch stop layer 106 is partially removed, in accordance with some embodiments. After the exposed portion of the etch stop layer 106 is removed, the recess 110 extends downwards to exposes the conductive feature 104. In some embodiments, the etch stop layer 106 is partially removed using a second etching process. In some embodiments, the second etching process is a wet etching process.

Figure 1F:
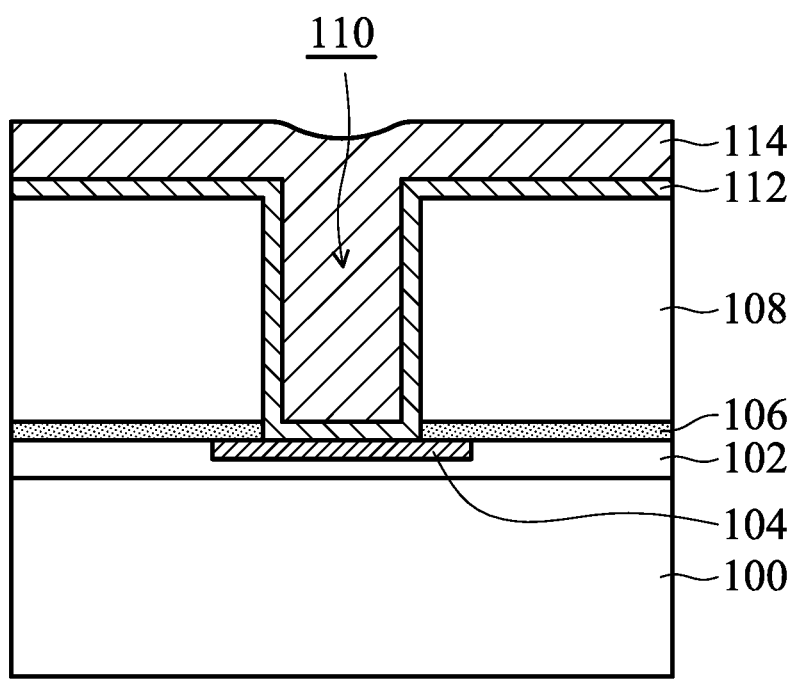

As shown in FIG. 1F, a barrier layer 112 is deposited over the dielectric layer 108, in accordance with some embodiments. The barrier layer 112 further extends along the bottom and sidewalls of the recess 110. The barrier layer 112 may be used to protect the dielectric layer 108 from diffusion of a metal material from a conductive layer that will be subsequently formed in the recess 110. The barrier layer 112 may also serve as an adhesion layer between the conductive layer and the dielectric layer 108.

In some embodiments, the barrier layer 112 is a single layer. In some other embodiments, the barrier layer 112 includes multiple sub-layers. In some embodiments, the sub-layers of the barrier layer 112 are made of the same material. In some other embodiments, some of the sub-layers of the barrier layer 112 are made of different materials. In some embodiments, the barrier layer 112 is in direct contact with the dielectric layer 108. In some embodiments, the barrier layer 112 is in direct contact with the etch stop layer 106. In some embodiments, the barrier layer 112 is in direct contact with the conductive feature 104.

In some embodiments, the barrier layer 112 is made of or includes titanium nitride, tantalum nitride, titanium, tungsten nitride, one or more other suitable materials, or a combination thereof. In some embodiments, the barrier layer 112 is deposited using a PVD process, a CVD process, an ALD process, an electroless plating process, an electroplating process, one or more other applicable processes, or a combination thereof.

Afterwards, a conductive layer 114 is deposited over the barrier layer 112, as shown in FIG. 1F in accordance with some embodiments. In some embodiments, the conductive layer 114 is made of or includes copper, aluminum, tungsten, titanium, cobalt, nickel, gold, platinum, one or more other suitable conductive materials, or a combination thereof. The barrier layer 112 may prevent metal ions of the conductive layer 114 from diffusing into the dielectric layer 108. In some embodiments, the conductive layer 114 is deposited using an electroplating process, an electroless plating process, a PVD process, a CVD process, a spin-on process, one or more other applicable processes, or a combination thereof.

Figure 1G:
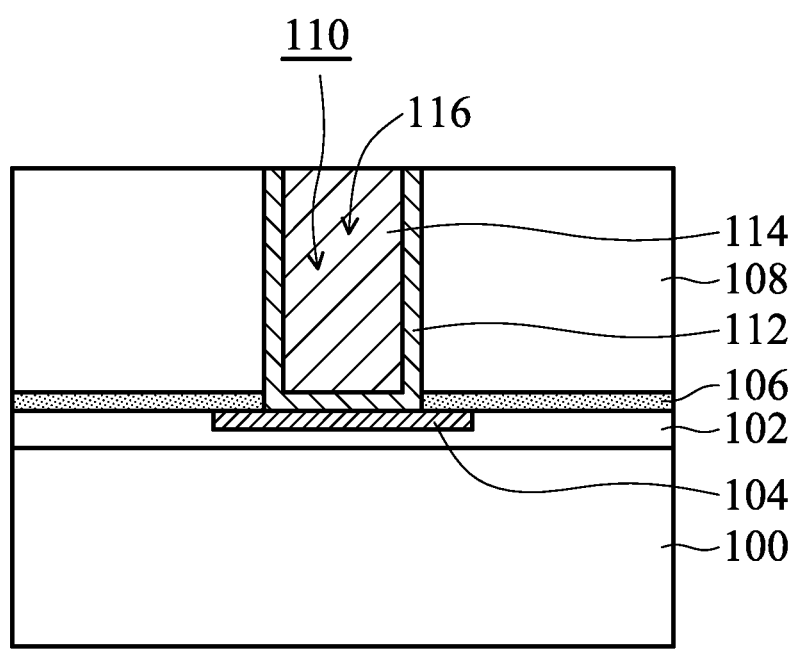

As shown in FIG. 1G, the portions of the conductive layer 114 and the barrier layer 112 outside of the recess 110 are removed, in accordance with some embodiments. As a result, a conductive structure 116 that includes the barrier layer 112 and the conductive layer 114 is formed. In some embodiments, the conductive structure 116 is a conductive via, and the conductive feature 104 is a conductive line.

In some embodiments, a planarization process is used to remove the portions of the conductive layer 114 and the barrier layer 112 outside of the recess 110. The planarization process may be performed on the conductive layer 114 until the dielectric layer 108 is exposed. The planarization process may include a chemical mechanical polishing (CMP) process, a grinding process, an etching process, a dry polishing process, one or more other applicable processes, or a combination thereof.

Due to the protection of the etch stop layer 106 during the formation of the recess 110, the quality and reliability of the conductive feature 104 may be maintained. In some embodiments, the etch stop layer 106 is made of or includes aluminum oxide which has a low dielectric constant and good etch stop ability. The etch stop layer 106 may be helpful for maintaining a low leakage current and a high breakdown voltage. Therefore, the electrical connection between the conductive feature 104 and the subsequently-formed conductive structure 116 may be ensured. The performance and reliability of the semiconductor device structure are thus improved.

As mentioned above, in some embodiments, the etch stop layer 106 is formed using a PVD process, a CVD process, an ALD process, a spin-on process, one or more other applicable processes, or a combination thereof. However, in some cases, the quality of the etch stop layer 106 formed using an ALD process or a CVD process is lower than that formed using a PVD process. For example, the etching selectivity between the dielectric layer 108 and the etch stop layer 106 formed using an ALD process or a CVD process is not sufficient. As a result, the performance and reliability of the semiconductor device structure may be negatively affected.

In some embodiments, the etch stop layer 106 is formed using a PVD process. The quality of the etch stop layer 106 formed using a PVD process may be better than that formed using an ALD process or a CVD process. In some embodiments, a pulse direct current (pulse-DC) PVD process is used to form the etch stop layer 106. In the pulse DC PVD process, a pulse DC power may be applied to a metal target during the formation of the etch stop layer 106.

However, in some cases, the etching selectivity between the dielectric layer 108 and the etch stop layer 106 formed using a pulse DC PVD process may still not be sufficient. The density of the formed etch stop layer 106 may not be high enough. Etchant used for forming the recess 110 might penetrates into the etch stop layer 106. As a result, the etch stop ability of the etch stop layer 106 may not be sufficient.

In some cases, a lower power is used in a pulse DC PVD process to improve the etch stop ability of the etch stop layer 106. However, if a lower power level is applied, the deposition rate of the etch stop layer 106 is also reduced. Fabrication time is therefore increased. In some cases, oxygen plasma generated during the pulse DC PVD process may have high energy. The oxygen plasma with high energy may cause damage to the etch stop layer 106 or the dielectric layer 108. The reliability or performance of the semiconductor device structure may be negatively affected.

In some embodiments, the etch stop layer 106 is formed using a PVD process that involves the application of radio frequency (RF) power. In some embodiments, the quality and reliability of the etch stop layer 106 formed using a PVD process that involves the application of RF power is much better than that formed using a pulse DC PVD process, an ALD process, or a CVD process.

Figure 3:
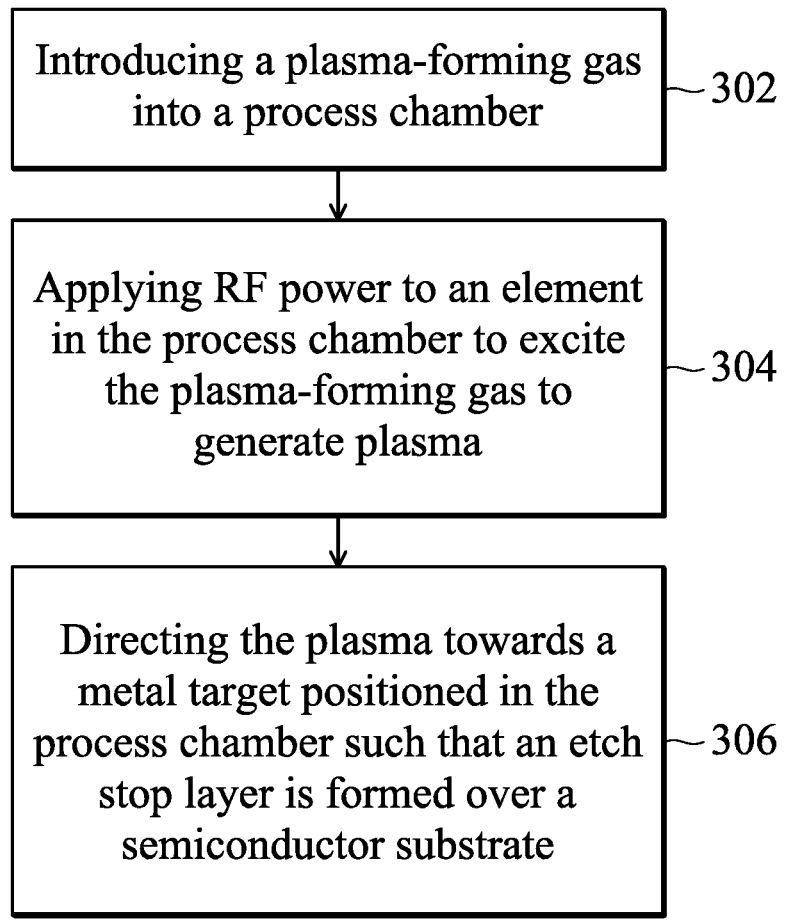
FIG. 3 is a flow chart illustrating a method for forming an etch stop layer, in accordance with some embodiments.

FIG. 3 is a flow chart illustrating a method 300 for forming an etch stop layer, in accordance with some embodiments. In some embodiments, the etch stop layer 106 is formed using the method 300.

Figure 2A:
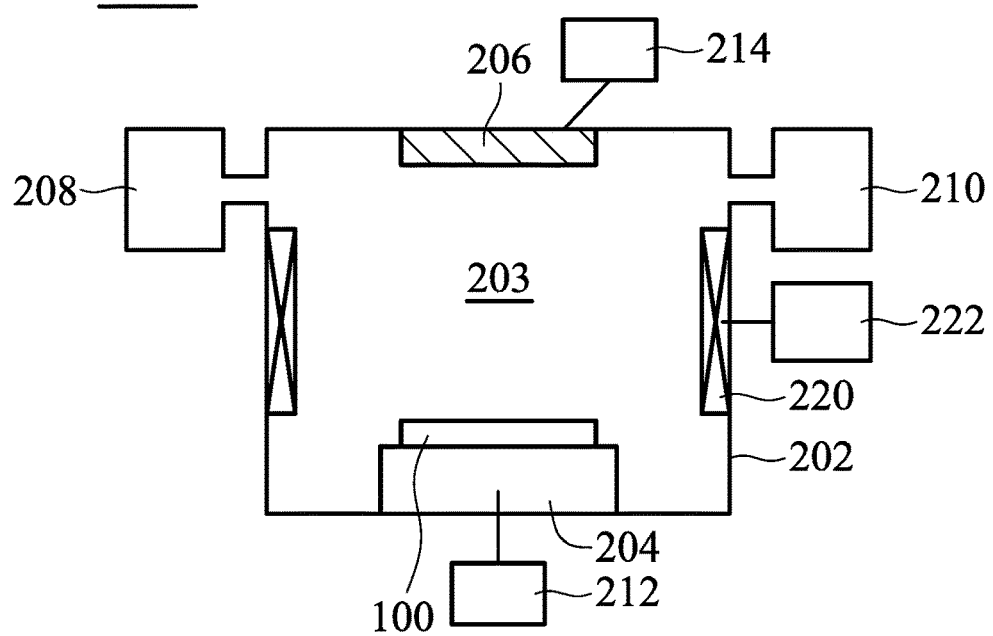
FIG. 2A shows a physical vapor deposition system, in accordance with some embodiments.

FIG. 2A shows a physical vapor deposition (PVD) system 200A, in accordance with some embodiments. In some embodiments, a PVD process that involves the application of RF power is performed in the PVD system 200A for forming the etch stop layer 106. In some embodiments, the method 300 illustrated in FIG. 3 is used to form the etch stop layer 106 in the PVD system 200A.

In some embodiments, the PVD system 200A includes a containment shield 202 and a power source 214. The containment shield 202 forms a process chamber 203 (a PVD chamber). In some embodiments, the power source 214 is RF power source. In some embodiments, the PVD system 200A has multiple elements in the process chamber 203. The elements include a substrate holder 204 and a metal target 206. A reaction gas provider 208 and a vacuum system 210 are connected to the process chamber 203.

The substrate holder 204 is configured to hold a substrate on which an etch stop layer is to be formed. The substrate holder 204 may include a heating element. Therefore, the substrate that is held thereon may be heated at a desired temperature during the formation process. The metal target 206 is used as a precursor material target to provide a precursor material for forming the etch stop layer 106. The reaction gas provider 208 is configured to introduce one or more reaction gases (such as plasma-forming gas) in to the process chamber 203. The vacuum system 210 is configured to maintain the process chamber 203 under an appropriate pressure. In some embodiments, the process chamber 203 is maintained under pressure that is in a range from about 10 mTorr to about 300 mTorr.

In some embodiments, the semiconductor substrate 100 is disposed in the process chamber 203. In some embodiments, the structure shown in FIG. 1A is transferred into the process chamber 203 and placed on the substrate holder 204 for forming the etch stop layer 106 as shown in FIG. 1B. For example, the method 300 illustrated in FIG. 3 is used to form the etch stop layer 106.

As shown in FIG. 3, the method 300 includes an operation 302 in which a plasma-forming gas is introduced into a process chamber, in accordance with some embodiments. In some embodiments, the plasma-forming gas is introduced into the process chamber 203 by the reaction gas provider 208, as shown in FIG. 2A. In some embodiments, the plasma-forming gas contains an oxygen-containing gas. For example, the plasma-forming gas contains oxygen gas. In some embodiments, the plasma-forming gas is a gas mixture including oxygen gas and an inert gas. For example, the inert gas includes argon gas. In some embodiments, the plasma-forming gas contains oxygen gas and argon gas. In some embodiments, a volumetric concentration ratio of oxygen gas to argon gas is in a range from about 3% to about 80%. In some cases, if the volumetric concentration ratio of oxygen gas to argon gas is smaller than about 3%, the oxygen content may not be enough, which may lead to poor quality of the etch stop layer 106. In some other cases, if the volumetric concentration ratio of oxygen gas to argon gas is greater than about 80%, too much oxygen plasma may be generated, which may damage the etch stop layer 106. In some other embodiments, the volumetric concentration ratio of oxygen gas to argon gas is controlled in a range from about 5% to about 60%.

As shown in FIG. 3, the method 300 includes an operation 304 in which RF power is applied to an element in the process chamber to excite the plasma-forming gas to generate plasma, in accordance with some embodiments. In some embodiments, the RF power is supplied to an element in the process chamber 203 by the power source 214 to excite the plasma-forming gas, as shown in FIG. 2A. In some embodiments, the element that is supplied with RF power is the metal target 206.

In some embodiments, the power source 214 provides RF power having a radio frequency that is in a range from about 13 MHz to about 55 MHz. For example, the frequency of the applied RF power is about 13.56 MHz, 27.12 MHz, 40.68 MHz, or 54.24 MHz. In some embodiments, the energy level of the applied RF power is in a range from about 0.1 kW to about 4.5 kW. In some other embodiments, the energy level of the applied RF power is in a range from about 0.5 kW to about 4 kW. In some embodiments, the power source 214 provides an AC voltage that is in a range from about −50 volts to about 30 volts.

Due to the applied RF power, an electric field is formed in the process chamber 203. The electric field is applied to the plasma-forming gas to generate ionization collision, thus forming plasma. The plasma may include oxygen plasma and argon plasma.

As shown in FIG. 3, the method 300 includes an operation 306 in which the plasma is directed towards a metal target positioned in the process chamber such that an etch stop layer is formed over a semiconductor substrate. In some embodiments, the ionized gas atoms or plasma (such as Ar plasma and/or oxygen plasma) are guided to bombard the metal target 206 and dislodge atoms from the metal target 206. The dislodged atoms from the metal target may also be excited to form plasma (such as Al plasma or the like). In some embodiments, plasma including aluminum plasma and oxygen plasma are then directed or attracted towards the semiconductor substrate 100 held on the substrate holder 204. The directed or attracted aluminum plasma and oxygen plasma may be slowed down to have lower energy. Aluminum plasma and oxygen plasma may react with each other and form aluminum oxide material on the substrate 100. As a result, the etch stop layer 106 is formed. Because aluminum plasma and oxygen plasma have lower energy, the etch stop layer 106 may be prevented from damage, and thus having a better quality.

In some embodiments, the etch stop layer 106 formed using the PVD process involving the application of RF power has a better quality and/or higher density than that formed using a pulse DC PVD process. In some embodiments, when the RF power provided by the power source 214 is increased, the deposition rate of the etch stop layer 106 is increased accordingly while the quality of the etch stop layer 106 may still be maintained. The etching selectivity between the etch stop layer 106 and the dielectric layer 108 may remain high.

In some embodiments, the etch stop layer 106 formed using the RF PVD process may be easier to be crystallized. For example, crystalline alumina grains may be formed in the etch stop layer 106 under a lower temperature, which may improve the etching selectivity between the etch stop layer 106 and the dielectric layer 108. In some embodiments, the deposition temperature of the etch stop layer 106 is in a range from about 250 degrees C. to about 350 degrees C. In some cases, if the deposition temperature is lower than about 250 degrees C., the etch stop layer 106 may not be dense enough. The etch stop ability may be low. In some other cases, if the deposition temperature is greater than about 350 degrees C., other elements that have been formed may be damaged.

In some embodiments, the energy of the generated plasma in the PVD system 200A is lower than that in a pulse DC PVD system. The generated oxygen plasma may have a lower energy accordingly. Therefore, the risk that the oxygen plasma may cause damage to the etch stop layer 106 or the dielectric layer 108 may be reduced.

As shown in FIG. 2A, a power source 212 is electrically coupled to the substrate holder 204, in accordance with some embodiments. The power source 212 provides a substrate bias to the substrate holder 204. Therefore, the semiconductor substrate 100 may be biased to attract the generated plasma so as to form the etch stop layer 106. In some embodiments, the semiconductor substrate 100 is negatively biased to reduce damage from the generated oxygen plasma. In some other embodiments, the power source 212 is used to provide RF power to the substrate holder 204. In some other embodiments, the semiconductor substrate 100 is biased at a voltage in a range from about −50 V to about 30 V. In some cases, if the bias voltage is lower than about −50 V or greater than about 30 V, the quality of the etch stop layer 106 may be negatively affected. In some embodiments, the semiconductor substrate 100 is not negatively biased since the generated oxygen plasma may have a lower energy due to the application of RF power. For example, the semiconductor substrate 100 is biased at a voltage in a range from above 0 V to about 10V. The film property of the etch stop layer 106 may be better. In some other embodiments, the semiconductor substrate 100 is biased at a voltage in a range from above 0 V to about 20V In some embodiments, the PVD system 200A further includes a plasma ionizer 220, as shown in FIG. 2A. In some embodiments, the plasma ionizer 220 is positioned in the process chamber 203. In some other embodiments, the plasma ionizer 220 is positioned outside of the process chamber 203. In some embodiments, the plasma ionizer 220 is positioned adjacent to the containment shield 202. In some embodiments, the metal target 206 and the plasma ionizer 220 are positioned on a first sidewall and a second sidewall of the process chamber 203, respectively. In some embodiments, the first sidewall and the second sidewall of the process chamber 203 are substantially perpendicular to each other.

Many variations and/or modifications can be made to embodiments of the disclosure. In some other embodiments, the PVD system 200A does not include the plasma ionizer 220.

As shown in FIG. 2A, a power source 222 is electrically coupled to the plasma ionizer 220. In some embodiments, the power source 222 provides RF power to the plasma ionizer 220. The plasma ionizer 220 may be used to ionize the falling metal atoms from the metal target 206 before the metal atoms reach the semiconductor substrate 100. The plasma ionizer 220 may also be used to ionize the plasma-forming gas introduced into the process chamber 203. In some embodiments, the plasma-forming gas is excited by the metal target 206 supplied with the power source 214 (RF power) and the plasma ionizer 220 at the same time.

Many variations and/or modifications can be made to embodiments of the disclosure. In some embodiments, two or more power sources are electrically coupled to the metal target 206.

Figure 2B:
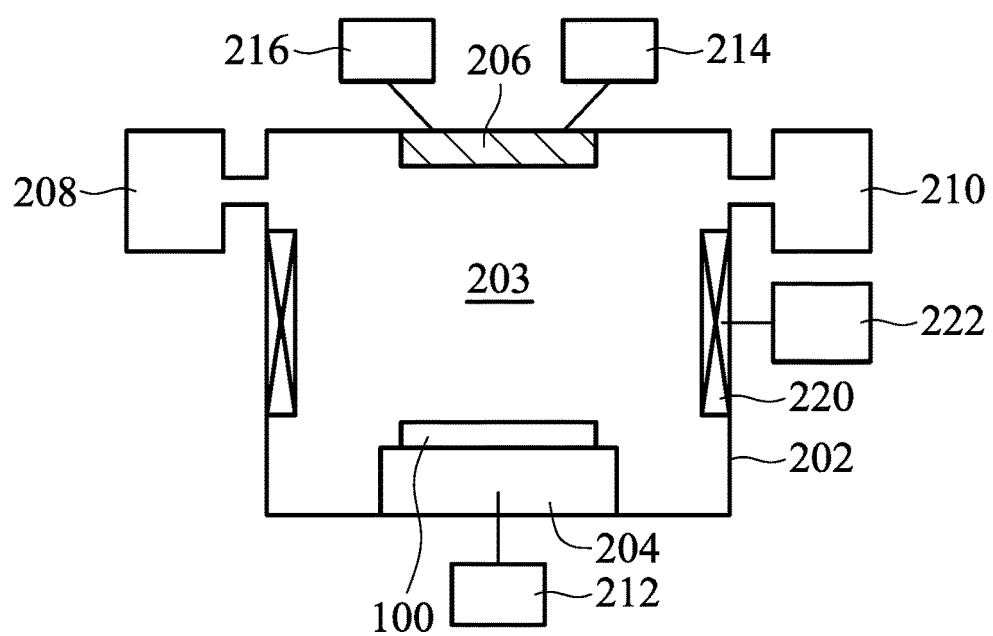
FIG. 2B shows a physical vapor deposition system, in accordance with some embodiments.

FIG. 2B shows a PVD system 200B, in accordance with some embodiments. In some embodiments, a PVD process that involves the application of RF power is performed in the PVD system 200B for forming the etch stop layer 106. In some embodiments, the method 300 is used to form the etch stop layer 106 in the PVD system 200B. Many variations and/or modifications can be made to embodiments of the disclosure. In some other embodiments, the PVD system 200B does not include the plasma ionizer 220.

As shown in FIG. 2B, a power source 216 is also electrically coupled to the metal target 206 in the process chamber 203, in accordance with some embodiments. In some embodiments, the power source 216 is used to provide a direct current (DC) power. In some embodiments, a DC power is further applied to the metal target 206 by the power source 216, as shown in FIG. 2B. In some embodiments, by using the power source 216, the metal target 206 is negatively biased. In some embodiments, the power source 216 provides a DC voltage to the metal target 206. The DC voltage may be in a range from about 110 volts to about 300 volts. In some embodiments, the power source 216 provides a DC power that is in a range from about 0.1 kW to about 3 kW. In some other embodiments, the provided DC power in in a range from about 0.5 kW to about 2.7 kW. In some embodiments, the power source 214 provides an RF power to the metal target 216. The energy level of the RF power may be in a range from about 0.3 kW to about 4.5 kW. In some embodiments, the power ratio of the DC power provided by the power source 216 to the RF power provided by the power source 214 is in a range from about 0.2 to about 9. The argon plasma may be directed to bombard the metal target 206 and dislodge atoms from the metal target 206 more efficiently due to the application of the DC voltage. In some embodiments, the pressure of the process chamber 203 is higher than about 20 mtorr. In these cases, the power ratio of the DC power provided by the power source 216 to the RF power provided by the power source 214 is controlled below 6 to ensure the quality of the etch stop layer 106. The ratio may be in a range from about 0.2 to about 6. In some embodiments, the power ratio of the DC power provided by the power source 216 to the RF power provided by the power source 214 is controlled in a range from about 0.25 to about 4.5 to avoid arcing. In some cases, if arcing occurs, the etch stop layer 106 and other devices formed in the semiconductor substrate 100 may be damaged.

Figure 2C:
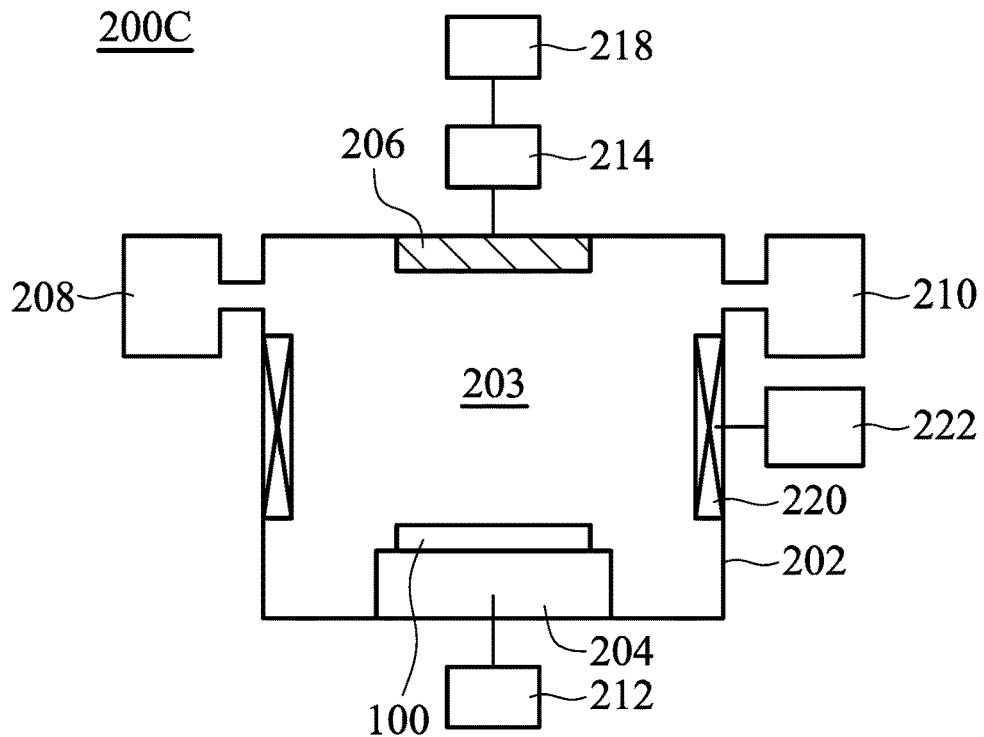
FIG. 2C shows a physical vapor deposition system, in accordance with some embodiments.

FIG. 2C shows a PVD system 200C, in accordance with some embodiments. In some embodiments, a PVD process that involves the application of RF power is performed in the PVD system 200C for forming the etch stop layer 106. In some embodiments, the method 300 is used to form the etch stop layer 106 in the PVD system 200C. In some embodiments, the power source 214 is electrically coupled to the metal target 206 to supply RF power to the metal target 206. The power source 214 is also electrically coupled in series with a power source 218 that is used to provide a DC power. Many variations and/or modifications can be made to embodiments of the disclosure. In some other embodiments, the PVD system 200C does not include the plasma ionizer 220.

Many variations and/or modifications can be made to embodiments of the disclosure. In some embodiments, the RF power is applied to an element other than the metal target 206.

Figure 2D:
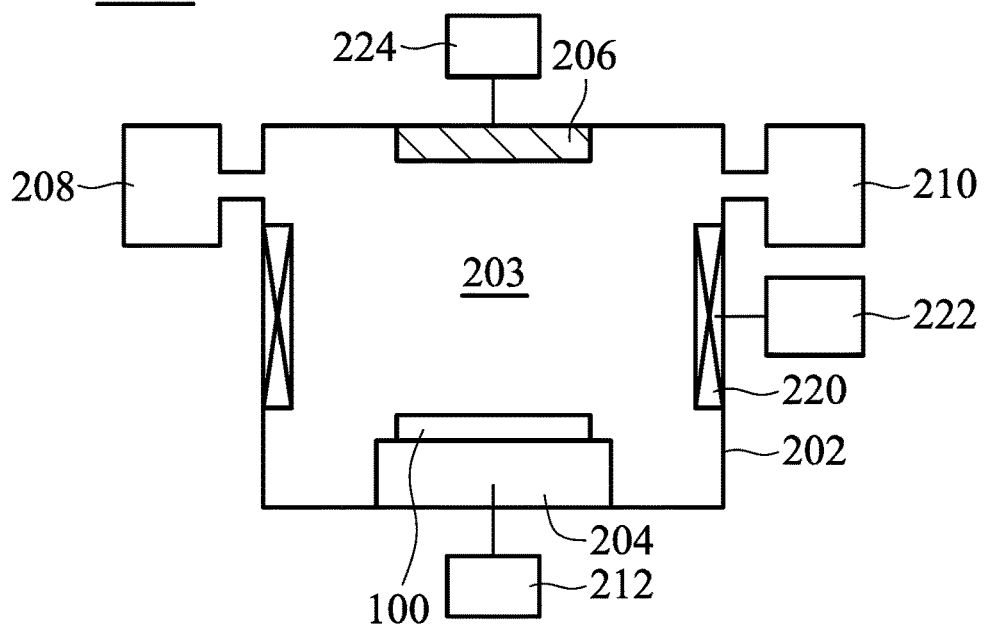
FIG. 2D shows a physical vapor deposition system, in accordance with some embodiments.

FIG. 2D shows a PVD system 200D, in accordance with some embodiments. In some embodiments, a PVD process that involves the application of RF power is performed in the PVD system 200D for forming the etch stop layer 106. In some embodiments, the method 300 is used to form the etch stop layer 106 in the PVD system 200D.

In some embodiments, a power source 224 is electrically coupled to the metal target 206, and the power source 224 is not RF power source. In some embodiments, the power source 224 is configured to provide the metal target 206 with a pulse DC power. The plasma ionizer 220 to which RF power is applied by the power source 222 may be used to excite the plasma-forming gas to generate plasma for forming the etch stop layer 106.

In some embodiments, a PVD process involving the application of radio frequency (RF) power is used to form an etch stop layer. The etch stop layer may be made of a metal oxide material such as aluminum oxide. However, embodiments of the disclosure are not limited thereto. The formed metal oxide layer may have a different or additional function other than etching stop. In some other embodiments, the metal oxide layer formed using the PVD process involving the application of RF power may be used as an insulating layer, a gate dielectric layer, a capacitor dielectric layer, a protection layer, or a combination thereof.

Embodiments of the disclosure form a semiconductor device structure with an etch stop layer. The etch stop layer is deposited using a PVD process that involves providing one or more RF power sources to one or more elements in a process chamber. For example, a metal target, a plasma ionizer, and/or a substrate holder in the process chamber may be supplied with RF power. The quality and reliability of the etch stop layer deposited accordingly may be better than an etch stop layer that is deposited using an ALD process, a CVD process, or a pulse DC PVD process. Since the quality and reliability of the etch stop layer is improved by using the RF PVD process, the performance of the semiconductor device structure is also improved.

In accordance with some embodiments, a method for forming a semiconductor device structure is provided. The method includes disposing a semiconductor substrate in a physical vapor deposition (PVD) chamber. The method also includes introducing a plasma-forming gas into the PVD chamber, and the plasma-forming gas contains an oxygen-containing gas. The method further includes applying a radio frequency (RF) power to a metal target in the PVD chamber to excite the plasma-forming gas to generate plasma. In addition, the method includes directing the plasma towards the metal target positioned in the PVD chamber such that an etch stop layer is formed over the semiconductor substrate.

In accordance with some embodiments, a method for forming a semiconductor device structure is provided. The method includes forming an etch stop layer over a semiconductor substrate in a physical vapor deposition (PVD) chamber. A radio frequency (RF) power is applied to an element in the PVD chamber to form the etch stop layer, and the etch stop layer contains aluminum oxide. The method also includes forming a dielectric layer over the etch stop layer, and the dielectric layer has a smaller dielectric constant than that of silicon dioxide. The method further includes forming an recess in the dielectric layer using an etching process, and the recess exposes the etch stop layer.

In accordance with some embodiments, a method for forming a semiconductor device structure is provided. The method includes disposing a semiconductor substrate in a physical vapor deposition (PVD) chamber and introducing a plasma-forming gas into the PVD chamber. The plasma-forming gas contains oxygen gas and an inert gas. The method also includes applying a radio frequency (RF) power to a metal target in the PVD chamber to excite the plasma-forming gas to generate plasma. The method further includes directing the plasma towards the aluminum target positioned in the PVD chamber such that an etch stop layer is formed over the semiconductor substrate, wherein the etch stop layer is made of metal oxide. In addition, the method includes forming a dielectric layer over the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    disposing a semiconductor substrate in a physical vapor deposition (PVD) chamber;
    introducing a plasma-forming gas into the PVD chamber, wherein the plasma-forming gas contains oxygen gas and an inert gas;
    applying a radio frequency (RF) power by a power source to a metal target in the PVD chamber to excite the plasma-forming gas to generate plasma, wherein the metal target is directly electrically coupled to the power source; and
    directing the plasma towards the metal target positioned in the PVD chamber such that an etch stop layer is formed over the semiconductor substrate.

2. The method for forming a semiconductor device structure as claimed in claim 1, further comprising applying a direct current (DC) power to the metal target, wherein the metal target is an aluminum target, and the etch stop layer contains aluminum oxide.

3. The method for forming a semiconductor device structure as claimed in claim 2, wherein the aluminum target is negatively biased, and a bias voltage applied to the semiconductor substrate is in a range from above 0 V to about 20V.

4. The method for forming a semiconductor device structure as claimed in claim 2, wherein the RF power is coupled in series with the DC power.

5. The method for forming a semiconductor device structure as claimed in claim 2, wherein a power ratio of the DC power to the RF power is in a range from about 0.25 to about 4.5.

6. The method for forming a semiconductor device structure as claimed in claim 1, further comprising applying a pulse direct current (DC) power to the metal target.

7. The method for forming a semiconductor device structure as claimed in claim 1, wherein the inert gas is argon gas.

8. The method for forming a semiconductor device structure as claimed in claim 1, further comprising exciting the plasma-forming gas using a plasma ionizer.

9. The method for forming a semiconductor device structure as claimed in claim 1, further comprising:
    forming a recess in a material layer to expose the etch stop layer; and
    removing the etch stop layer exposed by the recess; and
    forming a conductive structure in the recess.

10. The method for forming a semiconductor device structure as claimed in claim 1, wherein the RF power is provided by an alternating current (AC) voltage in a range from about −50 volts to about 30 volts.

11. The method for forming a semiconductor device structure as claimed in claim 1, wherein atoms from the metal target is excited to form metal plasma by the RF power.

12. The method for forming a semiconductor device structure as claimed in claim 1, wherein the metal target is electrically coupled to a direct current (DC) power source.

13. The method for forming a semiconductor device structure as claimed in claim 1, wherein the etch stop layer is formed in a range from about 250 degrees C. to about 350 degrees C.

14. A method for forming a semiconductor device structure, comprising:
    forming an etch stop layer over a semiconductor substrate in a physical vapor deposition (PVD) chamber, wherein a radio frequency (RF) power and a direct current (DC) power are applied to a metal target by a first power source and a second power source in the PVD chamber to form the etch stop layer, and the etch stop layer contains aluminum oxide, wherein the metal target is directly electrically coupled to the first power source and is electrically coupled to the second power source;
    forming a dielectric layer over the etch stop layer, wherein the dielectric layer has a smaller dielectric constant than that of silicon dioxide; and
    forming a recess in the dielectric layer using an etching process, wherein the recess exposes the etch stop layer.

15. The method for forming a semiconductor device structure as claimed in claim 14, wherein a DC voltage applied to the metal target is in a range from about 110 volts to about 300 volts, and the DC power is provided in a range from about 0.1 kW to about 3 kW.

16. The method for forming a semiconductor device structure as claimed in claim 14, wherein the RF power is provided in a range from about 0.1 kW to about 4.5 kW, and a frequency of the provided RF power is in a range from about 13 MHz to about 55 MHz.

17. A method for forming a semiconductor device structure, comprising:
    disposing a semiconductor substrate in a physical vapor deposition (PVD) chamber;
    introducing a plasma-forming gas into the PVD chamber, wherein the plasma-forming gas contains oxygen gas and an inert gas;
    applying a radio frequency (RF) power to a metal target in the PVD chamber to excite the plasma-forming gas to generate plasma, wherein the metal target is directly electrically coupled to a pulse direct current (DC) power source;
    directing the plasma towards the metal target positioned in the PVD chamber such that an etch stop layer is formed over the semiconductor substrate, wherein the etch stop layer is made of metal oxide; and
    forming a dielectric layer over the etch stop layer.

18. The method for forming a semiconductor device structure as claimed in claim 17, wherein the plasma-forming gas comprises oxygen gas and argon gas, and a volumetric concentration ratio of oxygen gas to argon gas is in a range from about 3% to about 80%.

19. The method for forming a semiconductor device structure as claimed in claim 17, further comprising exciting the plasma-forming gas using a plasma ionizer and applying the radio frequency (RF) power to the metal target to excite the plasma-forming gas at the same time.

20. The method for forming a semiconductor device structure as claimed in claim 19, wherein the metal target and the plasma ionizer are respectively positioned on a first sidewall and a second sidewall of the PVD chamber, and the first sidewall and the second sidewall are substantially perpendicular to each other.

* * * * *